(12) United States Patent
Lin

(10) Patent No.: US 6,249,126 B1
(45) Date of Patent: Jun. 19, 2001

(54) CAPACITY DETECTING CIRCUIT FOR A BATTERY

(76) Inventor: Tsun Huang Lin, No. 6, Alley 3, Lane 130, Nan Kang Rd., Sec. 3, Taipei (TW)

(*) Notice: Subject to any disclaimer, the term of this patent is extended or adjusted under 35 U.S.C. 154(b) by 0 days.

(21) Appl. No.: 09/339,036

(22) Filed: Jun. 23, 1999

(51) Int. Cl.[7] .............................. H02J 7/00; G01N 27/416
(52) U.S. Cl. ...................... 324/427; 370/136; 340/636; 702/63
(58) Field of Search ................................. 320/132, 134, 320/136; 324/427; 340/636; 702/63

(56) References Cited

U.S. PATENT DOCUMENTS 6,064,182 * 5/2000 Eguchi .................................. 320/132

* cited by examiner

Primary Examiner—Peter S. Wong
Assistant Examiner—Gregory J. Toatley, Jr.
(74) Attorney, Agent, or Firm—Bacon & Thomas, PLLC

(57) ABSTRACT

A capacity detecting circuit detects battery voltage and load current, compares the load current to the battery voltage to determine whether the voltage of the battery is sufficient, displays both the current and the relative capacity of the batteries, and cuts off power to the load if the battery voltage is too low, the current is excessive, or if the battery capacity is too low in comparison with said current.

5 Claims, 4 Drawing Sheets

TRUTH TABLE

| Contol Inputs | | | | ON Switches |
|---|---|---|---|---|
| Inhibit (INH) | Select | | | MC14051B |
| | C | B | A | |
| 0 | 0 | 0 | 0 | X0 |
| 0 | 0 | 0 | 1 | X1 |
| 0 | 0 | 1 | 0 | X2 |
| 0 | 0 | 1 | 1 | X3 |

Fig. 4

CAPACITY DETECTING CIRCUIT FOR A BATTERY

FIELD OF THE INVENTION

The present invention relates to the field of a capacity detecting circuit for a battery, and especially to a capacity detection circuit with a function that allows it to detect the capacity of the battery and that will also be able to automatically cut off the power supply to the electric circuit of the drive controlling device when there is a mismatch of polarities, a short circuit, or even an over-discharge from the battery.

BACKGROUND OF THE INVENTION

According to the speedy progress of modern society, the living standard of people is improving day by day and the current scientific technology also makes progress at a tremendous pace, leaving more leisure time and increasing the demand for convenient transportation by developing all kinds of transportation vehicles such as a bicycle, motorcycle, automobile, train, airplane, vessel, etc. For example, it is now a common situation for people with personal taste in enjoying leisure time to own at least one or even several luxury cars. The images of free transportation, comfortable interior decoration, and a wide-range of fanciful daydreams make a car become an incredible enjoyment in everyone's mind, a place for taking refuge and a place for the people to run after their favorite models from every kind of media.

A car is not just the most convenient vehicle in the world. Whether in the form of a sedan, wagon . . . , etc., a car is the best thing for travelling, especially in the hot season in case of no vacant hotel room, in which case the vehicle itself will settle the big headache by serving as a place to sleep.

Even having all kinds of the benefits from vehicles, one problem of car-owners is that someone might forget to turn off the headlights of the vehicle, or turn on the stereo equipment, fan, or even high beam for a long period of time, and force the battery to over-discharge and hence have it burn down or die. Furthermore the huge current caused by a car accident or short circuit might not only burn down the battery but also caused serious fires etc., which tragedies could be prevented if there was a device on the vehicles which had the function of an auto-cut off. Solving this problem of modern people has become a very important topic in present-day living.

SUMMARY OF THE INVENTION

In light of the above matters and based on good experience in studying and researching the field of designing and manufacturing a vehicle's batteries for many years, the inventor has thus created the present invention in order to overcome the known problems of the battery, and so as to achieve a practical effect at the same time.

Therefore, the preferred purpose of the invention is to provide a capacity detecting circuit for a battery that allows detection of the capacity of the battery and cut off of the power supply when the battery capacity is either insufficient or the battery is overcharged.

Another preferred purpose of the present invention is to supply a capacity detecting circuit for a battery that has a simple structure and a special function of detecting the capacity under different loading conditions.

Thus, according to an embodiment of the invention, it is desired to provide a capacity detecting circuit for a battery that comprises a voltage detecting circuit, a current detecting circuit, a switching circuit, a capacity display circuit, a timing circuit, and a driving circuit etc., which are all fixed onto appropriate positions of the battery. The current detecting circuit and voltage detecting circuit are installed in parallel, and the switching circuit is actually one kind of electronic switch and is installed at a position between the current detecting circuit and the capacity display circuit. The capacity display circuit comprises more than one set of LEDs and resistances. The design for the timing circuit is to add and install a timing loop circuit in the voltage detecting circuit and, furthermore, in the driving circuit, there is also an extra driving loop circuit which is installed onto the voltage detecting circuit.

An embodiment of the present invention will now be described by way of example with reference to the accompanying drawings.

BRIEF DESCRIPTION OF THE ILLUSTRATIONS

FIG. 4 is a 4051 B Truth Table in common use.

BRIEF DESCRIPTION OF THE SYMBOLS

| 10 | Voltage detecting circuit | RL1 ~ RL6 | Resistance |
|---|---|---|---|
| 11 | Current detecting circuit | R51 ~ R54 | Resistance |
| 12 | Switching circuit | R61 ~ R64 | Resistance |
| 13 | Capacity display circuit | R71 ~ R74 | Resistance |
| 14 | Timing circuit | R81 ~ R84 | Resistance |
| 15 | Driving circuit | R91 ~ R94 | Resistance |
| 16 | Manual switch | R101 ~ R104 | Resistance |
| A01 ~ A10 | Operational amplifier | X0 | No-loading |
| V01 ~ V10 | The input-port of Operational amplifier | X1 | Light-loading |
|  |  | X3 | Heavy-loading |
| VC0, VC1 | The input-port of Operational amplifier | X4 | Over-loading |
|  |  | INH | Whether the switching circuit is acting |
| Vref1 | Constant voltage |  |  |
| Vref2 | Reference voltage | LED1 ~ LED9 | Lamp set |
| Z1 ~ Z2 | Zener diode | C1 * R2 | Timing loop circuit |
| R1 ~ R6 | Resistance | A,B,C 4051B | output control |
| R01 ~ R02 | Resistance | D1 ~ D13 | diode |
| R21 ~ R22 | Resistance | I/O 4051B | Input/Output |
| R31 ~ R32 | Resistance |  |  |
| R41 ~ R42 | Resistance |  |  |
| RF | Resitiance |  |  |

DETAILED DESCRIPTION

Figure 1:
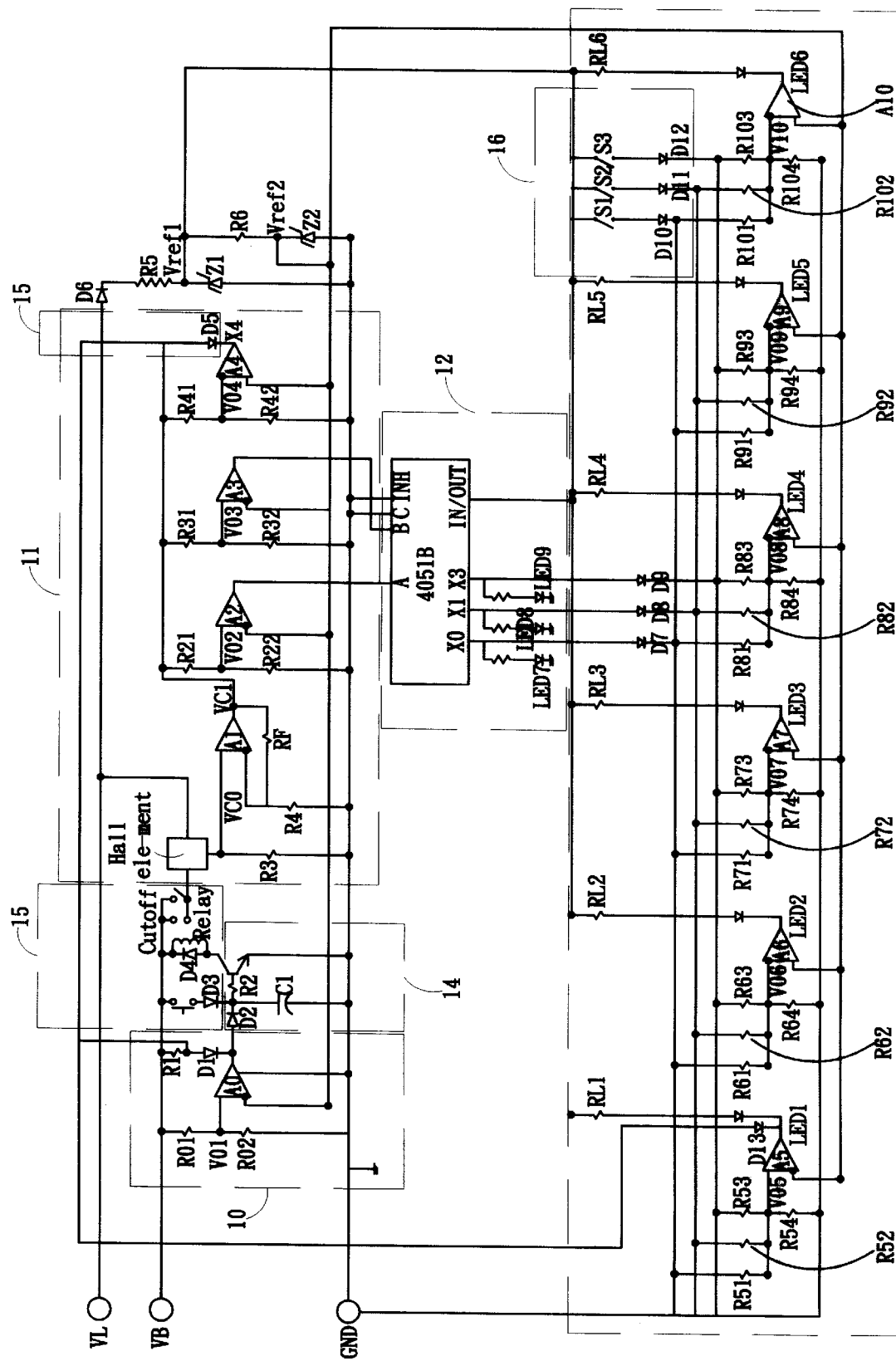
FIG. 1 is a sketch-map for the current circuit wiring of the present invention.
Figure 2:
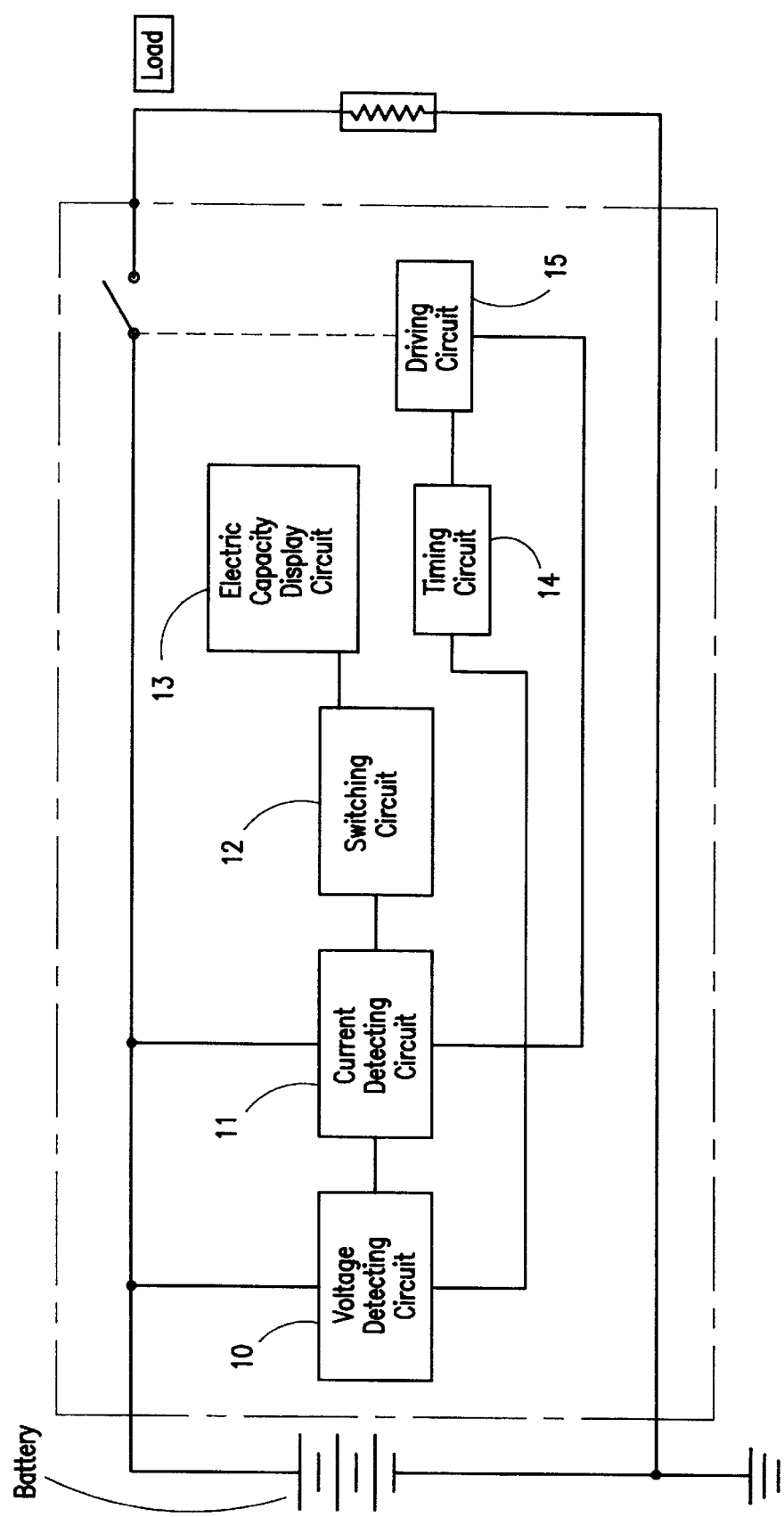
FIG. 2 is a block diagram of the present invention.

Firstly, with reference to both FIGS. 1 and 2, the present invention is a capacity detecting circuit for a battery, including a voltage detecting circuit 10, a current detecting circuit 11, a switching circuit 12, a capacity display circuit 13, a timing circuit 14, and also a driving circuit 15 etc.

By utilizing the Operational Amplifier A0, the voltage detecting circuit 10 will analyze the energy by comparing it with an output voltage value and then will prohibit the voltage from being supplied to a controlling device if the value of the output voltage is lower than the protection voltage, and according to the following details:

(1) Resistance R5 and constant voltage diode (Zener diode) Z1 will provide a constant operating voltage Vref1.

(2) Resistance R6 and constant voltage diode (Zener diode) Z2 will provide a constant reference voltage Vref2.

(3) When the value of V01 is larger than the value of reference voltage Vref2, the actual voltage of the battery is higher than the value of the protection voltage so that the voltage detecting circuit is in a normal operating condition. (V01 utilizes the voltage divided from both resistance R01 and R02.)

(4) At the time when the value of V01 is smaller than the value of reference voltage Vref2, the voltage of the battery is lower than the value of the protection voltage so that it will cut off the load automatically. (V01 utilizes the voltage divided from both resistance R01 and R02.)

Furthermore, the current detecting circuit 11 and voltage detecting circuit 10 are installed in parallel and arranged so that they will provide the necessary current signals when the battery is under the condition of checking the respective circuits and proceeding with operation according to a constant current controlling procedure. In addition, the two detecting circuits utilize a Hall Effect current sensor together with an isolation function in order to get the necessary current signals without causing interference between the controlling circuit and the electric power circuit while the said battery is under a discharging condition. Assuming that the value of rated current is 100 amperes and the ratio of the winding coils is 1/1000, if a current of 1 ampere passes through the one time winding coil unit, then a current of 0.001 ampere will appear between the ends of the double-wound coil unit. Moreover when the current passes through a resistance of 100 ohm which is connected serially to the double-wound coil unit, a voltage of 0.1 volt will be accordingly provided. After including the effect of the amplification provided by the Operational Amplifier (AF=(R4+RF)/R4), the current sensor will be able to measure the value of a voltage corresponding value of the current and then the current detecting circuit 12 will utilize Operational Amplifier A1 to create a direct current VC1 with the same effective value, which will be transferred into a current grading circuit for grading and finer analysis (such as for 10 amperes, 20 amperes, 50 amperes . . . ):

1. At the time the value of current is less than 10 amperes, the Operational Amplifier A2 will output a negative value signal of "−", and Operational Amplifier A3 will output a negative value signal of "−" as well;
2. At the time the value of current is between 10 amperes and 20 amperes, the Operational Amplifier A2 will output a positive signal "+", and Operational Amplifier A3 will output a negative value signal of "−" instead;
3. At the time the value of current is up to 20 amperes, the Operational Amplifier A2 will output a positive value signal of "+", and Operational Amplifier A3 will output a positive value signal of "+" as well;
4. At the time the value of current reaches 50 amperes, then the Operational Amplifier A4 will output a negative value signal of "−", and hence it will cut off the power supply automatically from the battery to the load drive controlling device.

The switching circuit 12 installed in a position between the current detecting circuit 11 and the capacity display circuit 13 is actually a multiplexer which includes no-load X0, light-load X1, and heavy-load X3 outputs together with the corresponding lamp sets LED7, LED8, LED9, (Please also refer to FIG. 4 of the 4051 Truth Table):

1. At the time the value of current is less than 10 amperes, input A="−", input B="−", then no-load output X0="+", and thus LED7 will turn on automatically;
2. At the time the value of current is between 10 amperes and 20 amperes, input A="+", input B="−", then light-load output X1="+", and thus LED8 will turn on automatically;
3. At the time the value of current is between 10 amperes and 50 amperes, input A="+", input B="+", then heavy-load output X3="+", and thus LED9 will turn on automatically.
4. At the time the signals of no-load output X0, light-load output X1, and heavy-load output X3 are all "+", then all of the LED7, LED8, and LED9 lamps will turn on, meaning that the value of current is still within the normal range;
5. At the time the value of current is over 50 amperes and A4 shows "−", there is a condition of over-loading at the output labeled IN/OUT, so that the battery will automatically cut off the power supply for driving the controlling device.

The capacity display circuit comprises more than one set of LED and resistance, and under the different loading conditions, will refer to switching circuit 12 for the status of no-load output X0, light-load output X1 and heavy-load output X3, and after the value of the voltage in the battery has been divided will provide a divided voltage with different impedances to corresponding input ports V05, V06, V07, V08, V09, V10 located on each Operational Amplifier A5, A6, A7, A8, A9, A10 to provide voltages V05~V10 as follows:

1. At the time the value of V05 is less than the reference voltage Vref2, the relevant LED1 will turn on a red lamp signal in order to send a message of warning that the capacity in the battery is insufficient and that the discharging operation will be prohibited accordingly;
2. At the time the value of V05 is larger than the reference voltage Vref2, LED1 will turn off to indicate that the capacity in the battery is probably sufficient and thus it will be necessary to observe the status of LED2 in order to confirm whether the battery capacity is sufficient;
3. At the time the value of V06 is larger than the reference voltage Vref2, LED2 will turn on a yellow lamp signal in order to indicate a warning that the capacity in the battery is on the edge of draining off very soon;
4. At the time the value of V06 is less than the reference voltage Vref2, LED2 will not light up any signal to indicate that the battery needs to be charged soon;
5. At the time the value of V07 is larger than the reference voltage Vref2, LED3 will turn on a green lamp signal in order to show that the capacity of the battery is sufficient;
6. At the time the value of V07 is less than the reference voltage Vref2, LED3 will not light up, thereby indicating that the capacity in the battery will drain off soon;
7. Same as the above condition (5), at the time the value of V08, V09, V10 are all larger than the reference voltage Vref2, lamps LED3, LED4, LED5, LED6 will all turn on green lamp signals in order to indicate that the capacity in the battery is quite sufficient (The more lamps light up the more sufficient capacity it has);
8. Same as the above condition (6), at the time the value of V08, V09, V10 are all smaller than the reference voltage Vref2, lamps LED3, LED4, LED5, LED6 will not light up any signal, thereby indicating that the capacity in the battery is insufficient;

In light of the above, it is very easy to determine whether the capacity in the battery is sufficient just by observing the status of LED1, LED2, LED3, LED4, LED5 and also LED6; and furthermore the capacity display circuit 13 also may be operated manually in order to observe the capacity of the battery while it is under different loading conditions.

The design for timing circuit 14 is to add and install a timing loop circuit C1*R2 in the voltage detecting circuit 10. The timing circuit 14 is installed with the voltage detecting circuit 10 and current detecting circuit 11 at the same time, i.e., in parallel, and thus when a voltage V01 is input into the system (V01 utilizes the voltage divided from the resistance R01, R02) and the voltage of the battery is higher than the reference voltage Vref2, the battery will be connected, but when the setting time is over and the voltage of the battery is lower than the reference voltage Vref2, the battery will automatically cut off the power supply for driving the controlling device.

1. Similar to the above, in the structure of driving circuit 15 there is also an extra driving loop circuit which is installed in the voltage detecting circuit 10, so that the driving circuit 15 is installed with the voltage detecting circuit 10 and current detecting circuit 1 1 at the same time; and hence while the voltage of the battery is less than the reference voltage Vref2, the battery will automatically cut off the power supply circuit for driving the controlling device when the setting time on timing circuit 14 is equalled or exceeded and the current detecting circuit 11 is detecting the output on A4 as "−" (which means the status of current is abnormal).

In view of the above, preferably all of the respective configurations for the circuits installed according to the present invention are fixed properly onto the battery.

Figure 3:
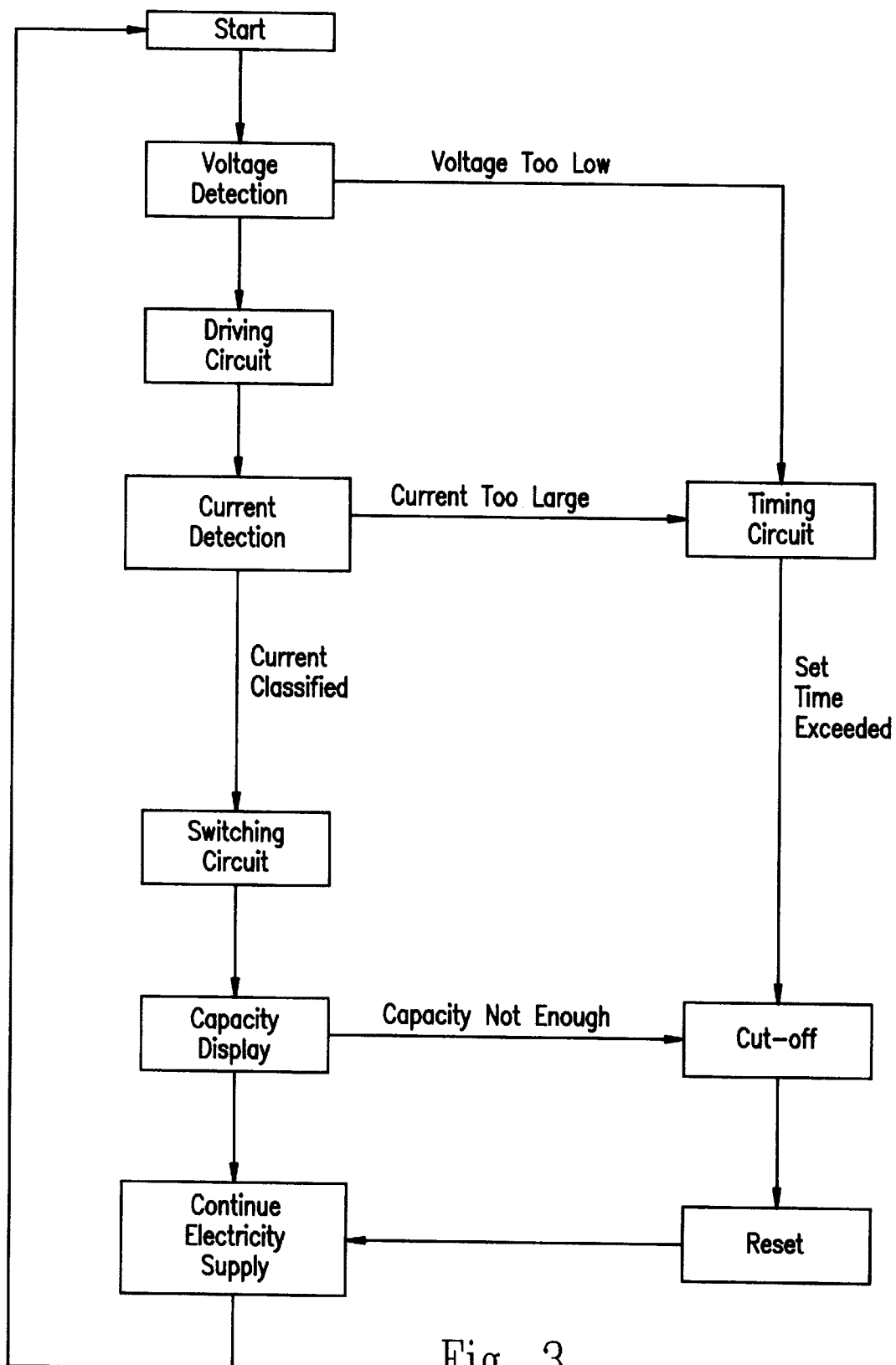
FIG. 3 is a flow chart of the present invention.

Finally, relying on the above structure and with reference to FIG. 3 which is a flow chart for the present invention, the following functions may be carried out:

1. According to the special functions provided by the present invention, the voltage detecting circuit 10 will detect the battery automatically and try to find out whether the voltage in the battery is in a normal condition or not:
   (1) At the time voltage detecting circuit 10 detects that a value of voltage is much lower than the normal value (or a status of breakdown while it is abnormal), then it will switch into timing circuit 14, and hence stop the power supply at once if it is over the setting time, or will supply the power accordingly only after the voltage value reverts to a normal condition.
   (2) At the time voltage detecting circuit 10 detects a normal condition, then the current detecting circuit 11 will force the driving circuit 15 to detect the status of the current automatically.
2. When the setting time on the timing circuit 14 has elapsed, the power supply will be stopped at once, and then will return to voltage detecting circuit 10 system once it has reverted properly.
3. The current detecting circuit 11 is able to treat the current into different grades such as no-load, light-load, heavy-load and over-load, as follows:
   (1) At the time the status of the current is overflow, the current detecting circuit will be able to test automatically whether it is allowable to supply the power again, will switch into the timing circuit 14 if it has determined that it is still not suitable, and also will stop supplying the power when it is over the setting time, but will supply the power again when it has reverted properly.
   (2) At the time everything is in normal status, then the current detecting circuit 11 will drive capacity display circuit 13 by means of switching circuit 13.
4. It is possible to find out whether the capacity in the battery is sufficient or not in order to supply the power just be means of the capacity display circuit 13.

Preferably, with the above-described special functions, the present invention detects the exact capacity in the battery, and hence it is very easy for the user to find out whether the capacity in the battery is sufficient or not. Furthermore, the invention will isolate both the battery and load when it is mismatched in polarity, in a condition of short circuit, or even when the battery is discharging excessively.

While a particular embodiment of the present invention has been illustrated and described, it would be obvious to those skilled in the art that various other changes and modifications can be made without departing from the spirit and scope of the invention. It is therefore intended to cover in the appended claims all such changes and modifications that are within the scope of the present invention.

What is claimed is:

1. A capacity detecting circuit for a battery, comprising:
   a voltage detecting circuit, a current detecting circuit, a switching circuit, and a capacity display circuit,
   wherein said voltage detecting circuit is connected to said battery and arranged to compare a voltage of said battery with a reference voltage and to signal said driving circuit to cut-off a connection between the battery and a load when the voltage of the battery is lower than the reference voltage,
   wherein said current detecting circuit is connected in parallel with said battery and said voltage detecting circuit, and is arranged to compare a detected current with a plurality of current thresholds and thereby classify said detected current into ranges,
   wherein said switching circuit includes a switching device and lamps connected to said outputs of said current detecting circuit, said switching circuit being arranged to convert said outputs of said current detecting circuit into current indicating signals indicative of an amount of current being supplied to said driving circuit, to illuminate respective lamps in response to said current indicating signals, and to cut-off said connection between said battery and said load if said current is excessive, and
   wherein said capacity display circuit includes a plurality of comparison circuits having inputs connected to said reference voltage through said resistors, and inputs connected to said switching circuit, said plurality of comparison circuits further having outputs each of which is connected to a respective resistance and lamp, said comparison circuits being thereby arranged to compare a load current-adjusted voltage of said battery with a resistance-adjusted reference voltage, and said comparison circuits thereby outputting signals representative of whether a capacity of said battery is sufficient to support said current being supplied to said driving circuit, and to cut-off said connection between said battery and said load if said capacity is insufficient.

2. A capacity detecting circuit as claimed in claim 1, wherein said current detecting circuit has four outputs A1 to A4, and is arranged to determine whether a detected current is:
   a. lower than a predetermined first threshold, in which case A1 to A4 are all negative values;
   b. above the predetermined first threshold, in which case A1 is a positive value and A2–A4 are negative values.
   c. above a predetermined second threshold, in which case A1 and A2 are positive values and A3 and A4 are negative values;

d. above a predetermined third threshold, in which case A1 to A3 are positive values and A4 is a negative value; and e. above a predetermined fourth threshold, in which case A1 to A4 are all positive values, wherein said switching circuit is connected to said four outputs of said current detecting circuit, said capacity display circuit including three lamps and a multiplexer arranged to convert said four inputs into no-load, light-load, heavy-load, and cut-off signals as follows:

f. if A1 to A4 are all negative values then a no-load signal is output and said first lamp is lit;

g. if A1 is a positive value and A2–A4 are negative values then a light-load signal is output and said second lamp is lit;

h. if A1 and A2 are positive values and A3 and A4 are negative values then a heavy load signal is output and said third lamp is lit;

i. if A1 to A3 are positive values and A4 is a negative value then said no-load, light-load, and heavy load signals are all output and said three lamps are all lit; and j. If A1 to A4 are all positive values then said current supplied to said driving circuit is cut-off.

3. A capacity detecting circuit as claimed in claim 1, wherein a number of said comparators, resistors, and lamps in said capacity display circuit is six to thereby indicate six ranges of battery capacity.

4. A capacity detecting circuit as claimed in claim 1, further comprising a timing circuit connected in parallel with said voltage detecting circuit and said current detecting circuit, said timing circuit being arranged to prevent cut-off of said load current for a predetermined time following detecting that said battery voltage is higher than said reference voltage.

5. A capacity detecting circuit as claimed in claim 1, wherein the capacity detecting circuit is arranged to be operated manually in order to by-pass said switching circuit and detect whether a capacity of said battery is sufficient to drive the load.

* * * * *